United States Patent

Frech et al.

[11] Patent Number: 5,914,533
[45] Date of Patent: Jun. 22, 1999

[54] MULTILAYER MODULE WITH THINFILM REDISTRIBUTION AREA

[75] Inventors: Roland Frech, Ostfildern; Hubert Harrer, Böblingen; Erich Klink, Schönaich, all of Germany; William F. Shutler, Wappinger Falls, N.Y.

[73] Assignee: International Business Machines Corporation, Armonk, N.Y.

[21] Appl. No.: 08/765,989

[22] PCT Filed: Jun. 6, 1995

[86] PCT No.: PCT/EP95/02153

§ 371 Date: Jan. 10, 1997

§ 102(e) Date: Jan. 10, 1997

[87] PCT Pub. No.: WO96/39716

PCT Pub. Date: Dec. 12, 1996

[51] Int. Cl.⁶ .................................................. H01L 23/34
[52] U.S. Cl. ........................... 257/700; 257/723; 257/758
[58] Field of Search .................................. 257/758, 723, 257/700

[56] References Cited

U.S. PATENT DOCUMENTS 5,475,264  12/1995  Sudo et al. ............................. 257/758

*Primary Examiner*—Peter Toby Brown
*Assistant Examiner*—Roy Potter
*Attorney, Agent, or Firm*—Marc A. Ehrlich

[57] ABSTRACT

The invention relates to a multilayer module 20 for packaging of at least one electronic component, such as the integrated circuit chips 21, 22. The module 20 comprises a thickfilm structure and a thinfilm structure. The thinfilm structure provides an interface between the electronic components and the thickfilm structure. The thinfilm structure comprises a first powerplane and a redistribution wiring structure. The topmost layer of conductors of the thickfilm structure is a second powerplane so that an electrical structure approaching a triplate structure is realized.

7 Claims, 4 Drawing Sheets

MULTILAYER MODULE WITH THINFILM REDISTRIBUTION AREA

The present invention relates to an improved multilayer module for packaging of at least one electronic component and to a method for fabricating such a multilayer module.

As VLSI circuits become more dense, there is a need in the art to have semiconductor packaging structures that can take full advantage of the density and speed of state of the art VLSI devices. Present day modules made of ceramic, typically multilayered ceramic modules are normally mounted onto cards or boards, with cards or boards combined together to form the central processing unit (CPU) of a computer. The multilayered ceramic (MLC) modules typically have VLSI chips mounted on the topsurface and typically have pins on the bottomsurface thereof even though there are multilayer ceramic modules which have alternative mounting means such as solderbumps.

As integrated circuit speeds and packaging densities-increase the importance of the packaging technology becomes increasingly significant. For example, as devices approach gigahertz speed, inductance effects and the like in the packaging become significant. Such inductance effects may arise from, for example, switching and the like, and are particularly problematic in power and ground leads. Inductance effects in the package can cause ground bounce, signal cross-talk, and the like.

The multilayer ceramic (MLC) multichip module (MCM) technology introduced by IBM represents a revolutionary advance in packaging state of the art and provides the high-performance wiring needed to exploit the gains achieved with todays integrated circuits logic devices. This technology is described for example in A. J. Blodgett, "A Multilayer Ceramic Multi-Chip Module," Proceedings of the Electronic Components Conference, IEEE, New York, 1988, pp. 283–285 and B. T. Clark and Y. M. Hill, "IBM Multichip Multilayer Ceramic Modules for LSI Chips—Designs For Performance and Density," IEEE Transactions Components, Hybrids. Manuf. Technology, CHMT-3, 89–93 (1980). Furthermore, the articles by A. J. Blodgett, D. R. Barbour, "Thermal Conduction Module: A High-Performance Multilayer Ceramic Package", IBM J. Res. Develop., vol. 26, no. 1, January 1982, and by A. J. Blodgett, "Microelectronic Packaging", Scientific American, July 1983, vol. 249, no. 1 describe this technology.

Even though the above referenced IBM technology mainly relies on thickfilm technology for the production of multilayer modules, proposals have been made in the prior art to combine thickfilm and thinfilm technology for the packaging of integrated circuits chips. U.S. Pat. No. 4 958 258 describes a modular hybrid microelectronic structure with a high density of integration. The structure comprises, on one face, an encapsulated hybrid circuit that groups together circuits with a high density of integration, formed by one or more semiconductor chips, said circuits being mounted on a thin-layer substrate. The thin-layer substrate is grown on a face of supporting, thick-layer substrate, preferably made of co-baked ceramic. Encapsulate, microelectronic components such as monolithic, integrated circuits are borne on the other face of the substrate. The interconnections among various components and with the exterior are made within and through the layers of the supporting substrate so that no wire or connection appears on the uncovered parts of the substrate.

Furthermore U.S. Pat. No. 4 549 200 and U.S. Pat. No. 4 916 259 propose the combination of thickfilm and thinfilm technologies for the production of packaging modules.

The fast development of the VLSI/ULSI CMOS chip technology aims to further increase the circuit density. This goes hand in hand with a corresponding increase in the number of I/O counts of a chip which is made possible by the FLIP CHIP technology, especially by the C4-technology. Todays multilayer module technologies are mainly based on either multilayer ceramic or multilayer glass-ceramic thickfilm technology. In both cases the line width, line spacing and insulator thickness are limited by the accompanying thickfilm technologies. The same restrictions are valid for card and board technologies which make use of multilayer glass epoxy and multilayer teflon based insulator materials. Therefore the thickfilm chip carrier technologies do not always satisfy the requirements of modern highly integrated chip technologies.

It is therefore an object of the present invention to provide an improved multilayer module combining thickfilm and thinfilm technologies.

The underlying problem of the invention is solved by a multilayer module according to claim 1.

According to the invention multilayer thickfilm and multilayer thinfilm technologies are combined. The multilayer thinfilm structure on top of the multilayer thickfilm structure significantly reduces the number of layers of thickfilm needed for the construction of a module. This is due to the line width below 25 micrometer which is made possible by the thinfilm technology as compared to line width limited to 80–100 micrometer of thickfilm multilayer technologies.

It is particularly advantageous to realize the redistribution area in the uppermost portion of the multilayer module in thinfilm technology, because the redistribution area is particularly sensitive to noise due to the high I/O count of modern chips and the narrow pitch of the chip footprint. The thinfilm structure provides an interface between the electronic component to be packaged and the underlying thickfilm structure. The redistribution wiring of the thinfilm structure is interposed between a first powerplane such as ground and a second powerplane such as a voltage plane. The second powerplane is the first powerplane of the thickfilm structure. Even though the distance of the thinfilm redistribution wiring structure from the second powerplane of the thickfilm structure is much greater than the distance from the thinfilm redistribution wiring structure to the first powerplane of the thinfilm structure which is situated in the uppermost region of the thinfilm structure, the electrical characteristics of the thinfilm redistribution wiring structure is comparable to an ideal triplate structure which is normally used in the X/Y wiring area of a multilayer ceramics module.

Thereby the provision of a second powerplane forming part of the thinfilm structure is made unnecessary. The production of such a thinfilm structure having only two metal layers is much easier and less costly than the production of a thinfilm structure having an ideal triplate structure like in the X/Y wiring area of the module which consists of four metal layers (GND-X-Y-Voltage).

According to the invention an equivalent structure can also be used for a multilayer printed circuit board. In this case the thickfilm structure forms the underlying mechanical structure of the multilayer printed circuit board. If such a multilayer module or multilayer printed circuit board is incorporated into a computer system, this is beneficial for the overall performance of the system and also reduces the production costs of the computer system. The increase of the performance of the computer system is due to the fact that the improved multilayer module and/or multilayer printed circuit boards according to the invention allow the system to take full advantage of high performance integrated circuit chips.

One way of carrying out the invention is described in detail below with reference to the drawings which illustrate only one specific embodiment, in which:

FIG. 1 a schematic, cross sectional view of a state of the art multilayer module in thickfilm technology;

Figure 1:
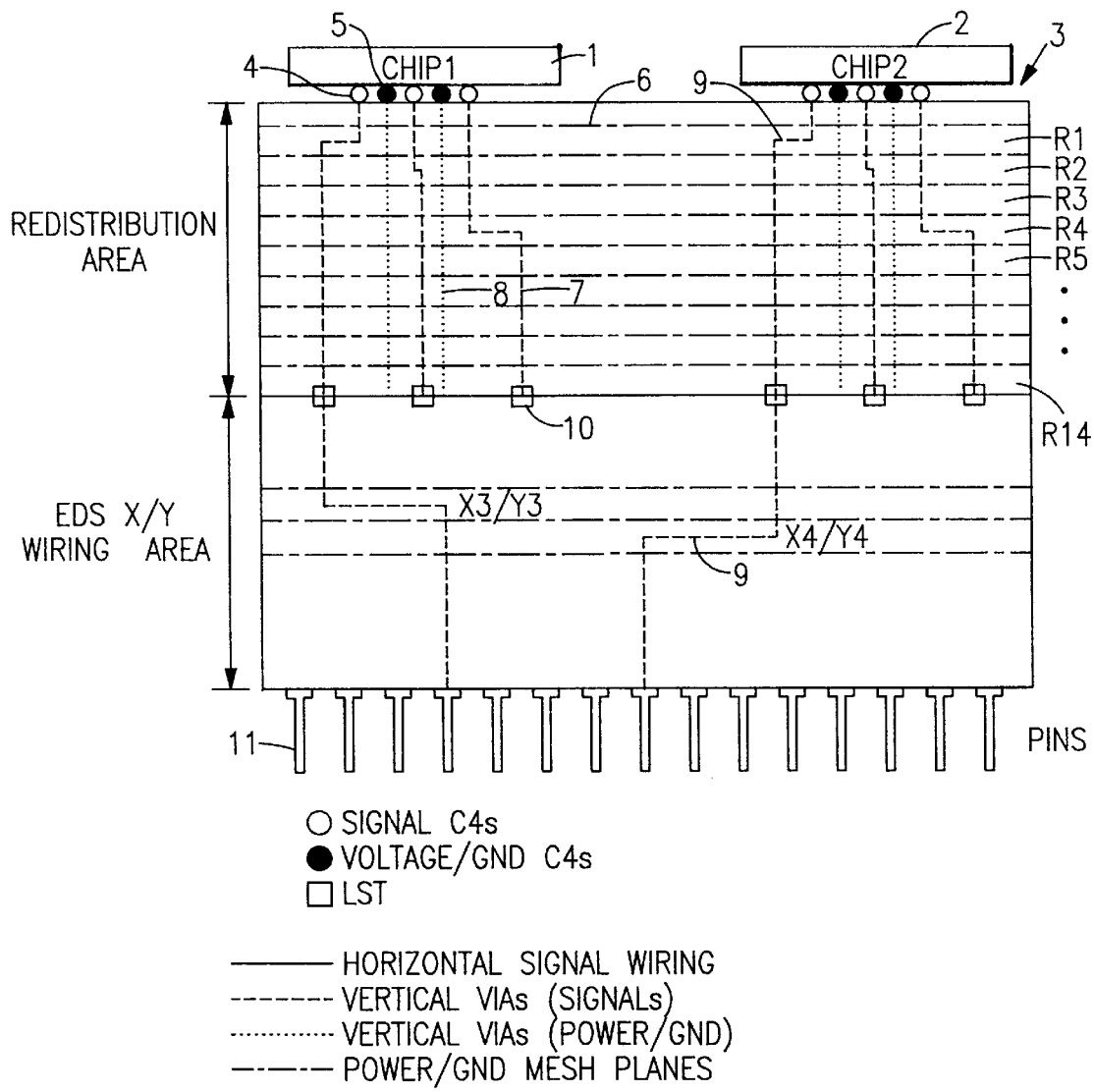

FIG. 1 shows a state of the art module 3. The module carries chips 1 and 2 which are connected to the module by the C4-balls 4 and 5. The C4-balls 4 connect the signal I/Os of the chips 1 and 2 to the module whereas the solid C4-balls 5 connect the voltage and ground terminals of the chips 1 and 2 to the module 3. In the redistribution area of the module 3 the signals of the chips 1 and 2 are fanned out. This is necessary because of the narrow pitch of the chip footprints. The redistribution area has the redistribution planes R1, R2, R3, R4, R5, . . . , R14. Each redistribution plane is interposed between power and ground GND mesh planes 6. The redistribution planes contain horizontal signal wiring 9 to fan out the signals. The vertical connections in the module 3 are established by vertical vias 7 and 8. The vertical vias 7 carry the signals and the vertical vias 8 carry power and ground. At the end of the redistribution area logic service terminals LST provide the interface to the X/Y wiring area. The X/Y wiring area comprises X/Y wiring planes which establish the connections from one chip to another chip or from one chip to the pins 11 of the module 3. In FIG. 1 only two wiring plane pairs are shown, i.e. X3/Y3 and X4/Y4.

The dense wiring and wire structures in the redistribution area below the chip lead to significant off-chip driver noise values due to electromagnetic coupling and delta I noise voltages. As compared to this, the electrical characteristics of the X/Y wiring area is much better due to the less dense wiring and the constantly used triplate structures. In the X/Y wiring area it is guaranteed that the signal wiring is always embedded between voltage and ground mesh planes 6.

The fan-out capability with respect to low noise of the thickfilm technology in the redistribution area is limited to I/O counts around 500 to 700 signals.

Figure 2:
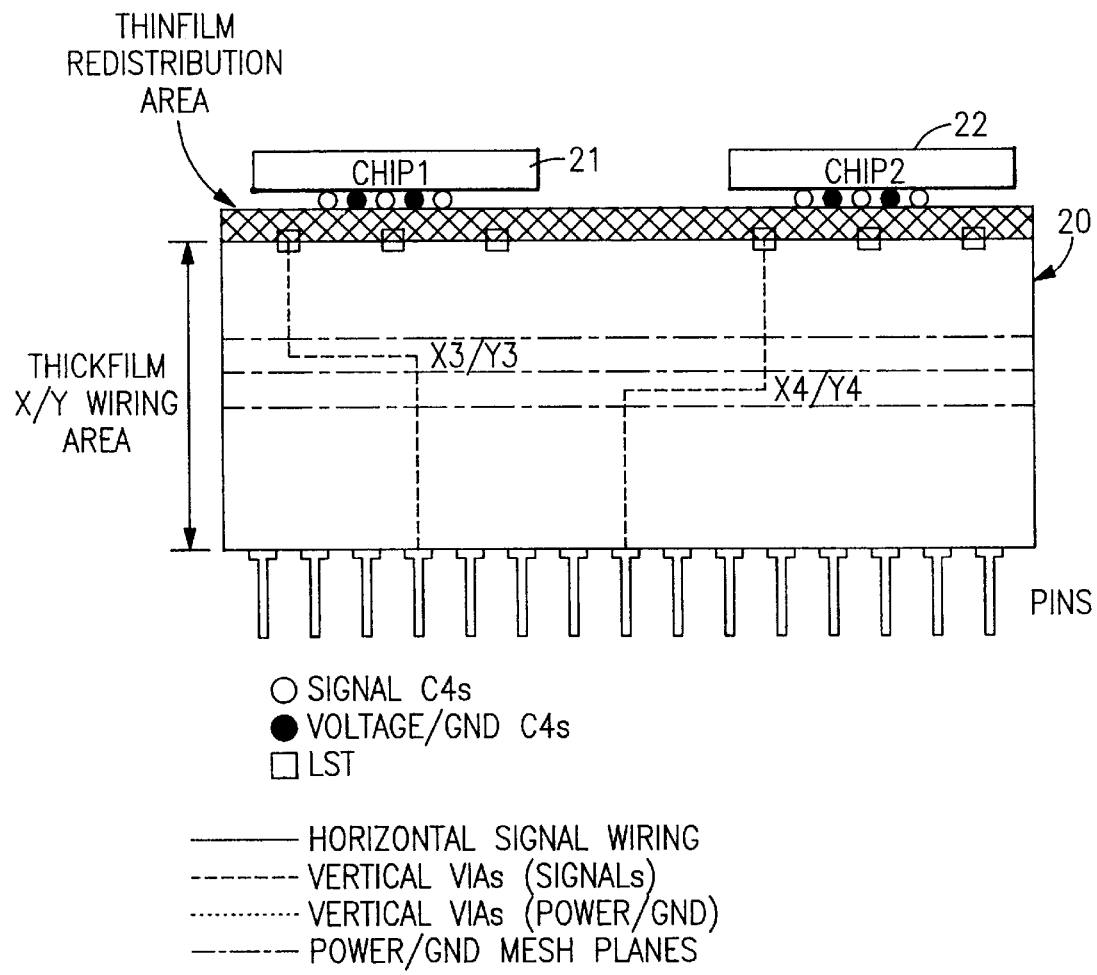
FIG. 2 is a schematic, cross sectional view of a multilayer module according to the invention.

FIG. 2 shows a multilayer module 20 which is designed according to the invention. The multilayer module 20 has a X/Y wiring area which corresponds to the X/Y wiring area of the multilayer module 3 shown in FIG. 1. The X/Y wiring area of the multilayer module 20 is implemented in thickfilm technology like the X/Y wiring area of the module 3, however, instead of a thickfilm redistribution area the module 20 has a thinfilm redistribution area.

The thinfilm redistribution area carries the chips 21 and 22, and serves to fan out the signals from chips 21 and 22. The thinfilm technology makes it possible to realize the redistribution of the signal vias in the thinfilm redistribution area in one layer of thinfilm wiring. The thinfilm redistribution area provides an interface between the chips 21 and 22 and the thickfilm X/Y wiring area of the module 20. The vertical signal vias of the thinfilm redistribution area are connected to the thickfilm X/Y wiring area at the logic service terminals.

The topmost layer of wiring of the thinfilm structure is a powerplane, such as a thinfilm ground mesh plane. The design of the topmost area of the module 20 is explained in more detail with respect to FIG. 3 which shows a magnified view of the topmost portion of the multilayer module 20 of FIG. 2.

Figure 3:
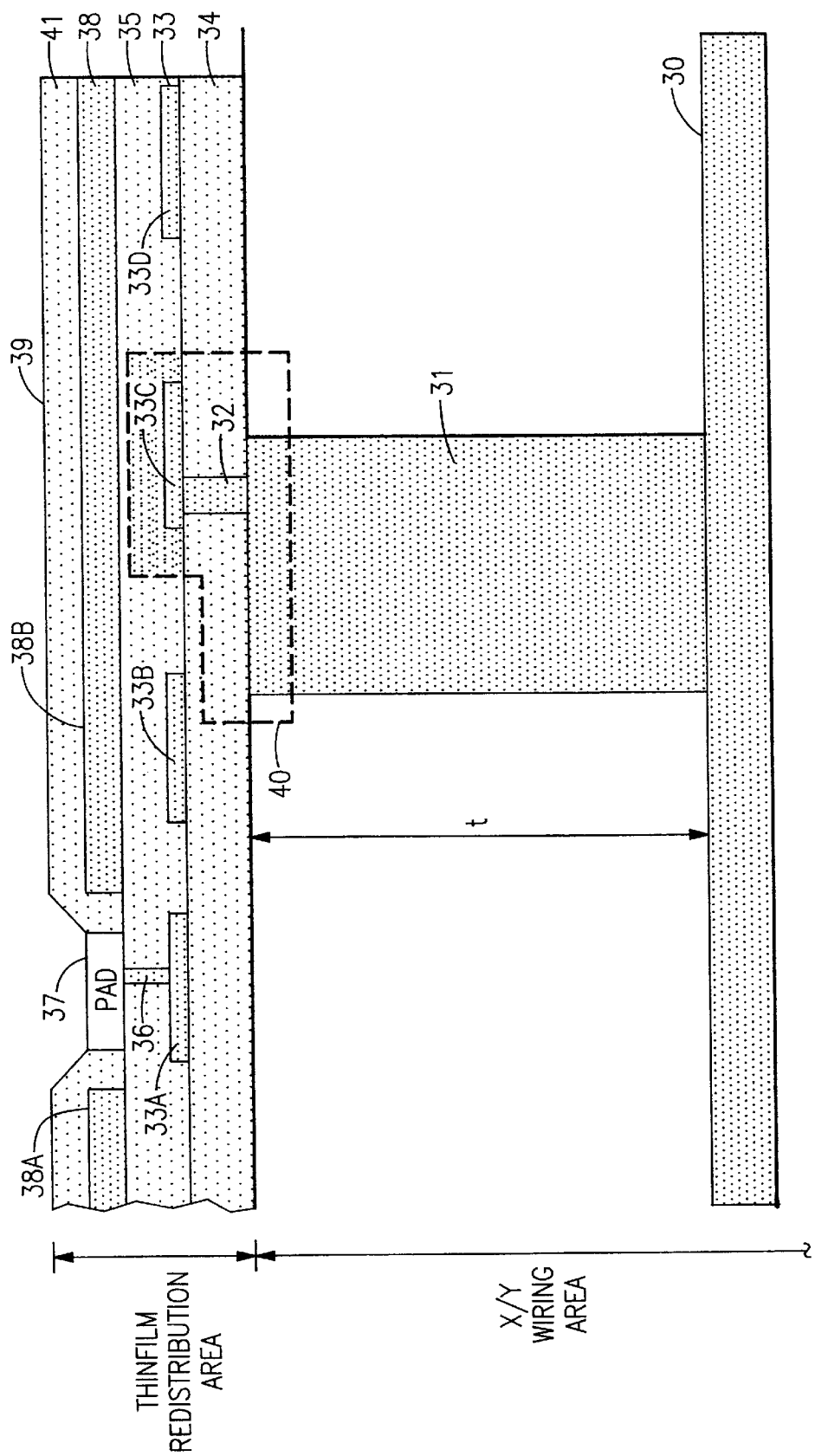
FIG. 3 is a magnified cross sectional view of the upper portion of a multilayer module according to the invention.

FIG. 3 shows the topmost voltage mesh plane 30 of the X/Y wiring area of the module 20. The voltage mesh plane 30 is realized in conventional thickfilm technology, such as multilayer ceramics. The thickness of the wiring structure of the voltage mesh plane 30 is about 35 micrometers. The voltage mesh plane 30 is contacted by a via 31 which still is in the thickfilm X/Y wiring area. The via 31 penetrates the topmost layer of thickfilm ceramic of the thickfilm structure of the module 20. The diameter of the via 31 is about 100 micrometers and the thickness t of the topmost thickfilm layer of the X/Y wiring area is about 250 micrometers to 350 micrometers. The topmost thickfilm layer of the thickfilm structure is planarized, so that the thickfilm structure has a planarized ceramic surface at the interface to the overlaying thinfilm structure.

The thinfilm structure serves as a redistribution area. The thinfilm redistribution area has one layer of thinfilm wiring 33 comprising the portions 33a, 33b, 33c and 33d. The line width of the thinfilm wiring 33 is about 25 micrometers as is the line spacing.

The thinfilm structure has a second wiring layer which is a thinfilm ground mesh plane 38. The ground mesh plane 38 has holes to implement pads 37 for the connection of electronic components such as integrated circuit chips 21, 22 to the module 20. In the example considered here the pads 37 serve as a contact terminal for the C4-balls of the chips 21, 22. The thinfilm wiring 33 is separated from the planarized ceramic surface of the thickfilm X/Y wiring area by a thinfilm layer 34. The thinfilm wiring 33 is separated from the thinfilm ground mesh plane 38 by a second thinfilm layer 35. The thinfilm layer 34 has vias 32 which connect the thinfilm wiring 33 to the vias 31 of the thickfilm X/Y wiring area. By way of example only one such via 31 and 32 is shown in FIG. 3. The vias 32 have a diameter of only about 10 micrometers. The connection of the via 32 to the via 31 provides a logic service terminal 40.

The second thinfilm layer 35 has vias 36 which serve to connect the thinfilm wiring 33 to the pads 37. In FIG. 3 only one such via 36 is shown by way of example. The via 36 connects the portion 33a of the thinfilm wiring 33 to the pad 37. The module 20 has a further thinfilm layer 41 atop the thinfilm ground mesh plane 38 in order to mechanically protect the underlying structures. The pads 37 are not covered by the thinfilm layer 41. The thickness of the layers 34 and 35 is about 9 micrometers, whereas the thickness of the layers 38 and 41 is about 5 micrometers.

Even though the distance of the thinfilm redistribution wiring 33 to the multilayer ceramics voltage mesh plane 30 is much greater than the distance of the redistribution-wiring 33 to the thinfilm ground mesh plane 38 the electrical characteristics of this structure approach the characteristics of a perfect triplate structure which is realized in the X/Y wiring area for example for the wiring planes X3/Y3 and X4/Y4 in FIG. 2.

The larger distance of the thinfilm wiring 33 to the multilayer ceramics voltage mesh plane 30 is compensated by the very short distance of the thinfilm wiring 33 to the thinfilm ground mesh plane 38.

The excellent electrical characteristic of the thinfilm redistribution area according to the invention is described and compared to other technologies in the following table.

|  | MLC-Redistrib. | MLC-X/Y layers | Thinfilm redistrib. "without triplate" | Thinfilm redsitrib. "with triplate" |
|---|---|---|---|---|
| Impedance | 45 Ohm | 50 Ohm | 70 Ohm | 45 Ohm |
| propagation delay (ps/cm) | 120 ps/cm | 120 ps/cm | 70 ps/cm | 70 ps/cm |
| Noise voltage at near end (5 mm - Vne/mV) | 200 mV | 150 mV | 300 mV | <80 mV |
| Noise voltage at far end (Vfe/mV) | 400 mV | 100 mV | 150 mV | <10 mV |

The electrical values indicated in the first column of the table are representative for the multilayer ceramics redistribution area of the state of the art multilayer module 3 of FIG. 1. The electrical values indicated in column 2 of the table are representative for the thickfilm X/Y wiring area of both module 3 of FIG. 1 and module 20 of FIG. 2 and 3. Column 3 of the table is representative of a thinfilm redistribution area without a "triplate" structure. This means that the thinfilm ground mesh plane 38 is left away so that the thinfilm wiring 33 is not interposed between two power planes. The fourth column of the table is representative of a thinfilm redistribution area as shown in FIG. 3. It appears from the table that the thinfilm redistribution area according to the invention has excellent electrical characteristics as compared to the other technologies.

Figure 4:
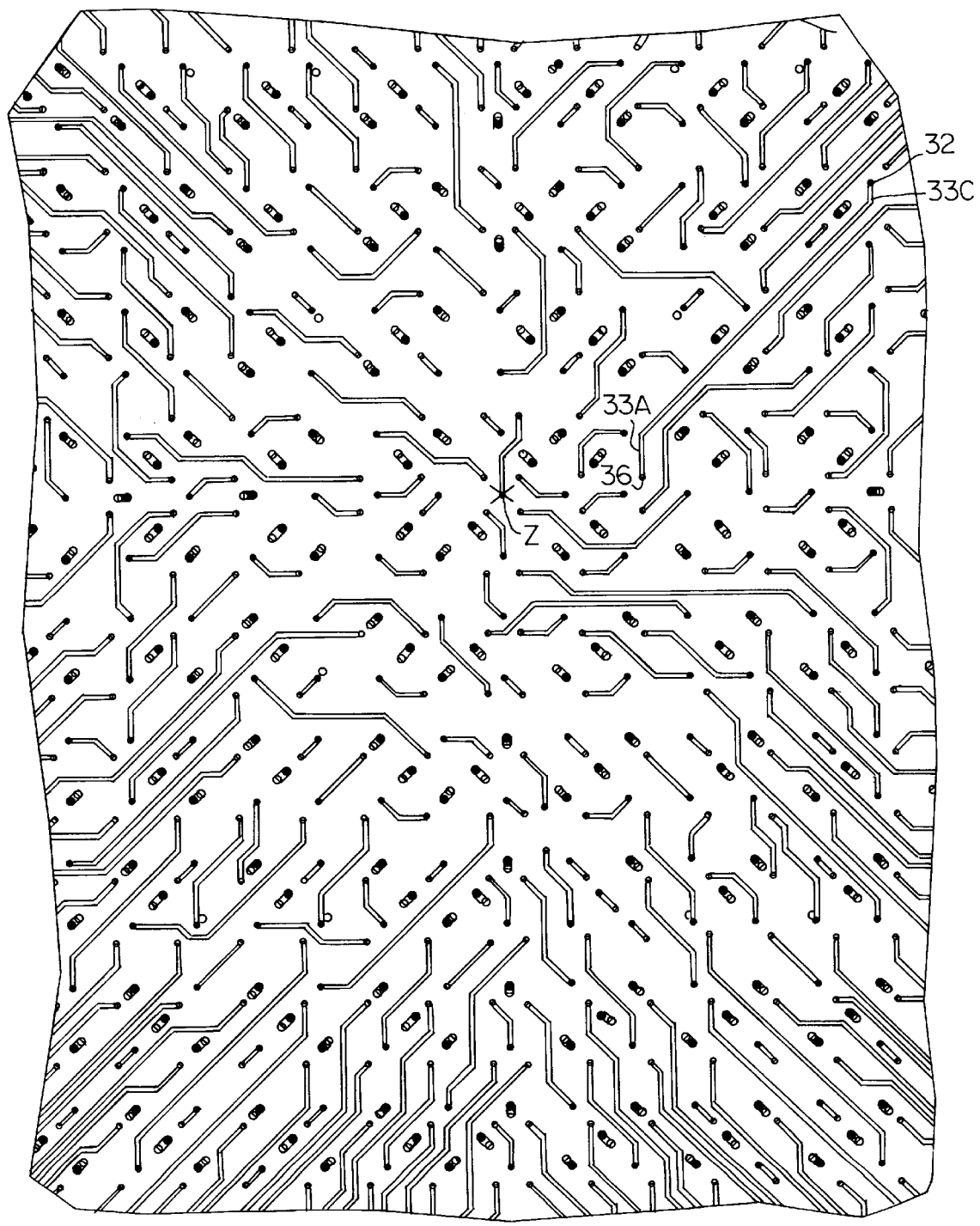
FIG. 4 is a circuit diagram of a portion of the redistribution wiring structure in the thinfilm structure.

FIG. 4 shows a partial topview of the thinfilm wiring 33. The portions 33a and 33c of one wire of the thinfilm wiring 33 of FIG. 4 corresponds to the portions 33a and 33c of FIG. 3. This wire of the thinfilm wiring plane 33 is connected by the vias 36 and 32 at its ends.

The wires of the thinfilm wiring plane 33 are arranged in starlike fashion having the point Z as center or—in other words vanishing point. This makes it possible to realize the redistribution in just one plane.

The multilayer module 20 of FIGS. 2, 3 and 4 is fabricated as follows:

First the thickfilm X/Y wiring area of the module 20 is produced using a known thickfilm technology. Then a layer of thinfilm material, such as polyimide is deposited atop the thickfilm X/Y wiring area. Thereby the layer 34 is realized. Subsequently vias 32 are implemented in the layer 34. This can be accomplished by selectively exposing the layer 34 to a laser and subsequently sputtering copper into the vias 32.

In the next step the thinfilm redistribution wiring plane 33 is deposited atop the layer 34. A second layer of polyimide is deposited a top the redistribution wiring 33. Thereby the layer 35 is realized. Again, the layer 35 is exposed to a laser and the corresponding vias 36 are sputtered with copper. Finally the first powerplane is deposited atop the layer 35. Thereby the thinfilm ground mesh plane 38 is realized.

We claim:

1. A multilayer module for the packaging of at least one electronic component, said module comprising:
a thickfilm structure having layers of conductors and a thinfilm structure, said thinfilm structure providing an interface between said electronic component and said thickfilm structure, wherein said thinfilm structure comprises a first power plane (38) and a redistribution wiring structure (33, 33a, 33b, 33c, 33d) and wherein the topmost layer of the conductors of said thickfilm structure is a second power plane (30), the redistribution wiring structure being interposed between said first power plane and said second power plane.

2. A multilayer module according to claim 1 wherein the distance between said redistribution wiring structure and said second power plane is substantially greater than the distance between said redistribution wiring structure and said first power plane.

3. A multilayer module according to claim 1 wherein said thickfilm is fabricated from material from the group consisting of: ceramic, glass-ceramic, glass-epoxy, teflon and a flexible foil.

4. A computer system incorporating a multilayer module for packaging of at least one electronic component, such as a single or multichip module, according to claim 1.

5. A method for fabricating a multilayer module according to claim 1 comprising the steps of:
a) fabricating said thickfilm structure;
b) depositing a first layer of thinfilm, such as polyimide atop said thickfilm structure;
c) providing vias in said first layer of thinfilm;
d) depositing said redistribution wiring structure atop said first layer of thinfilm;
e) depositing a second layer of thinfilm, such as polyimide, atop said redistribution wiring structure;
f) providing vias in said second layer of thinfilm;
g) depositing said first power plane atop said second layer of thinfilm; and
h) providing contact means, such as contact pads, in said first power plane for connecting said electronic component to said module.

6. A method according to claim 5 further comprising a step of depositing a third layer of polyimide atop said first power plane except for portions of said first power plane where said contact means, such as contact pads (37), are provided.

7. A method according to claim 5 further comprising a step of planarizing said thickfilm structure prior to carrying out said step b).

* * * * *